(12) United States Patent  
Khlat

(10) Patent No.: US 7,109,816 B2  
(45) Date of Patent: Sep. 19, 2006

(54) DUAL PORT MODULATOR COMPRISING A FREQUENCY SYNTHESISER

(75) Inventor: Nadim Khlat, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/046,075

(22) Filed: Jan. 28, 2005

(65) Prior Publication Data

US 2005/0175137 A1    Aug. 11, 2005

(30) Foreign Application Priority Data

Jan. 30, 2004    (EP)    .................................. 04290262

(51) Int. Cl.  
    H03K 7/04    (2006.01)
(52) U.S. Cl. .............................. 332/112; 332/127; 331/2
(58) Field of Classification Search .................... 331/2; 332/112, 127, 128; 455/76, 180.3  
    See application file for complete search history.

(56) References Cited

U.S. PATENT DOCUMENTS

| | | | |
|---|---|---|---|
| 5,021,754 A | 6/1991 | Shepherd | |
| 5,111,162 A | 5/1992 | Hietala | |
| 5,493,700 A | 2/1996 | Hietala | |
| 5,495,206 A | 2/1996 | Hietala | |
| 5,752,175 A | 5/1998 | Roullet | |
| 5,856,766 A | 1/1999 | Gillig | |
| 6,094,569 A * | 7/2000 | Wang | ........................ 455/313 |
| 6,104,222 A * | 8/2000 | Embree | ....................... 327/156 |

(Continued)

FOREIGN PATENT DOCUMENTS

DE    10065657 A1    7/2002

OTHER PUBLICATIONS

Ritzberger et al., "Concepts for Complete Integration of Synthesizers for GHz Frequencies," IEEE, 2000, pp. 412-417.

*Primary Examiner*—Joseph Chang  
*Assistant Examiner*—Levi Gannon

(57) ABSTRACT

A dual-port modulator comprising a first Phase Locked Loop ('PLL') (15) including a first Voltage Controlled Oscillator ('VCO') (10), a first variable frequency divider (20), a first multi-accumulator sequence generator (21) responsive to a phase modulation signal for controlling the division ratio (1/Nr) of the first variable frequency divider, a first phase detector (30) responsive to the relative phases of the reference signal and the first frequency divider signal for producing a first control signal through a first low pass filter (40). The frequency synthesiser also comprises a second PLL (14) including a second VCO (201), the first control signal being applied to the tuning port of the second VCO (201), a second variable frequency divider (203), a second multi-accumulator sequence generator (204) responsive to a phase modulation signal (261) for controlling the division ratio (1/Nt) of the second variable frequency divider, and a second phase detector (202) responsive to the relative phases of the second VCO signal and the second frequency divider signal for applying a second control signal to the tuning port of the second VCO (201) through a second low pass filter (208), the first and second frequency dividers (20, 203) being arranged to divide the frequency of the first VCO signal, and the bandwidth of the first PLL (15) being substantially smaller than the bandwidth of the second PLL (14).

The modulator is applicable in a transceiver also including a demodulator PLL (306, 307) including the second VCO (201), the modulator being arranged to be inactive during periods when the demodulator is active and the demodulator being arranged to be inactive during periods when the modulator is active, such as dual-standard transceiver operating according to WCDMA and PCS/DCS standards.

9 Claims, 3 Drawing Sheets

U.S. PATENT DOCUMENTS 6,211,747 B1   4/2001  Trichet
6,553,089 B1 * 4/2003  Huh et al. .................. 375/376
6,933,798 B1 * 8/2005  Hammes et al. ............ 332/127

* cited by examiner

DUAL PORT MODULATOR COMPRISING A FREQUENCY SYNTHESISER

FIELD OF THE INVENTION

This invention relates to a dual port modulator comprising a frequency synthesiser and more specifically to a synthesiser for use in a wide-band radio transmitter, especially but not exclusively the transmitter part of a transceiver.

BACKGROUND OF THE INVENTION

Frequency synthesisers have been developed in recent years which permit direct modulation of a carrier signal generated by a Phase Locked Loop (PLL) circuit by rapidly varying the instantaneous value of a variable divider forming part of the PLL circuit; the variable divider is controlled by a digital signal output from a sigma-delta type multi-accumulator digital circuit which acts to shape the noise generated by such a system so that it mostly occurs at higher frequencies where it can be more easily filtered out (by the natural Low Pass Filter behaviour of the closed PLL) before transmission of the signal.

Such frequency synthesisers are able to produce very well controlled modulation with a low enough Signal to Noise Ratio (SNR)—and in particular Signal to Phase-Noise Ratio—at relatively low modulation frequencies to find many practical applications. However, as a result of the type of noise shaping employed by the multi-accumulator digital circuit, it is difficult to maintain such a low SNR where a higher bandwidth is required for the modulation signal. This is because the noise shaping reduces the amount of low frequency noise at the expense of increasing the amount of high frequency noise.

As shown in FIG. 1 of the accompanying drawings, our U.S. Pat. No. 6,211,747 describes a direct modulation multi-accumulator fractional-N frequency synthesiser 1 for generating a modulated RF signal 110 by modulating a carrier signal by a modulation signal 170, 121, the frequency synthesiser comprising a Voltage Controlled Oscillator ('VCO') 10 having a tuning port for controlling the frequency of the signal 110 output by the VCO, a variable divider 20 and a sigma-delta multi-accumulator sequence generator 21 for controlling the variable divider 20, a reference frequency generator 50, a phase detector 30 and a low pass filter 40. The output of the reference frequency generator 50 is connected to a negative input 29 of the phase detector 30. The input of the variable divider 20 is connected to receive the output of the VCO 10 and the output of the variable divider 20 is connected to a positive input 28 of the phase detector 30 so that the variable divider 20, the phase detector 30, the low pass filter 40, an adder circuit 41 and the VCO 10 form a Phase Locked Loop ('PLL'), the directly modulated output signal of which is taken from the output of the VCO; in-band modulation is performed by varying the divide ratio of the variable divider and out-of-band modulation is performed by directly applying the modulating signal to the VCO tuning port through the adder circuit 41.

It will be appreciated that the expression 'in-band modulation' refers generally to modulation of the carrier frequency by components of the entire modulation signal whose frequency does not exceed the corner frequency of the low pass filter, while 'out-of-band modulation' refers to modulation of the carrier frequency by components of the entire modulation signal whose frequency does exceed the corner frequency of the low pass filter, knowing that the corner frequency is actually a smooth transition. The precise definition of in-band or out-of-band modulation is essentially unimportant in the present context, since the transfer characteristics of the out-of-band modulation are complementary to the transfer characteristics of the in-band modulation.

The synthesiser described in U.S. Pat. No. 6,211,747 offers satisfactory solutions to the problems referred to above. However, we have encountered difficulties, especially with transmitters for signals according to standards such as Enhanced Data for GSM Evolution (EDGE) and Wide-band Code Division Multiple Access ('WCDMA'), for example, where large bandwidth phase modulation is applied by a PLL and amplitude modulation is applied by a power amplifier. In particular, the VCO may suffer from pull-in effects due to Voltage Standing Wave Ratio ('VSWR') changes on the leads to the VCO due to the amplitude modulation, for example. Also, the system may be sensitive to matching of the gain of analogue control of the VCO, due to its variation with temperature and frequency, for example.

There is a need for a frequency synthesiser comprising a dual port modulator for use in a wide-band radio transmitter that provides a cost-effective solution to such difficulties with a minimum power consumption.

SUMMARY OF THE INVENTION

The present invention provides a frequency synthesiser as described in the accompanying claims.

DETAILED DESCRIPTION OF THE PREFERRED EMBODIMENTS

Figure 1:
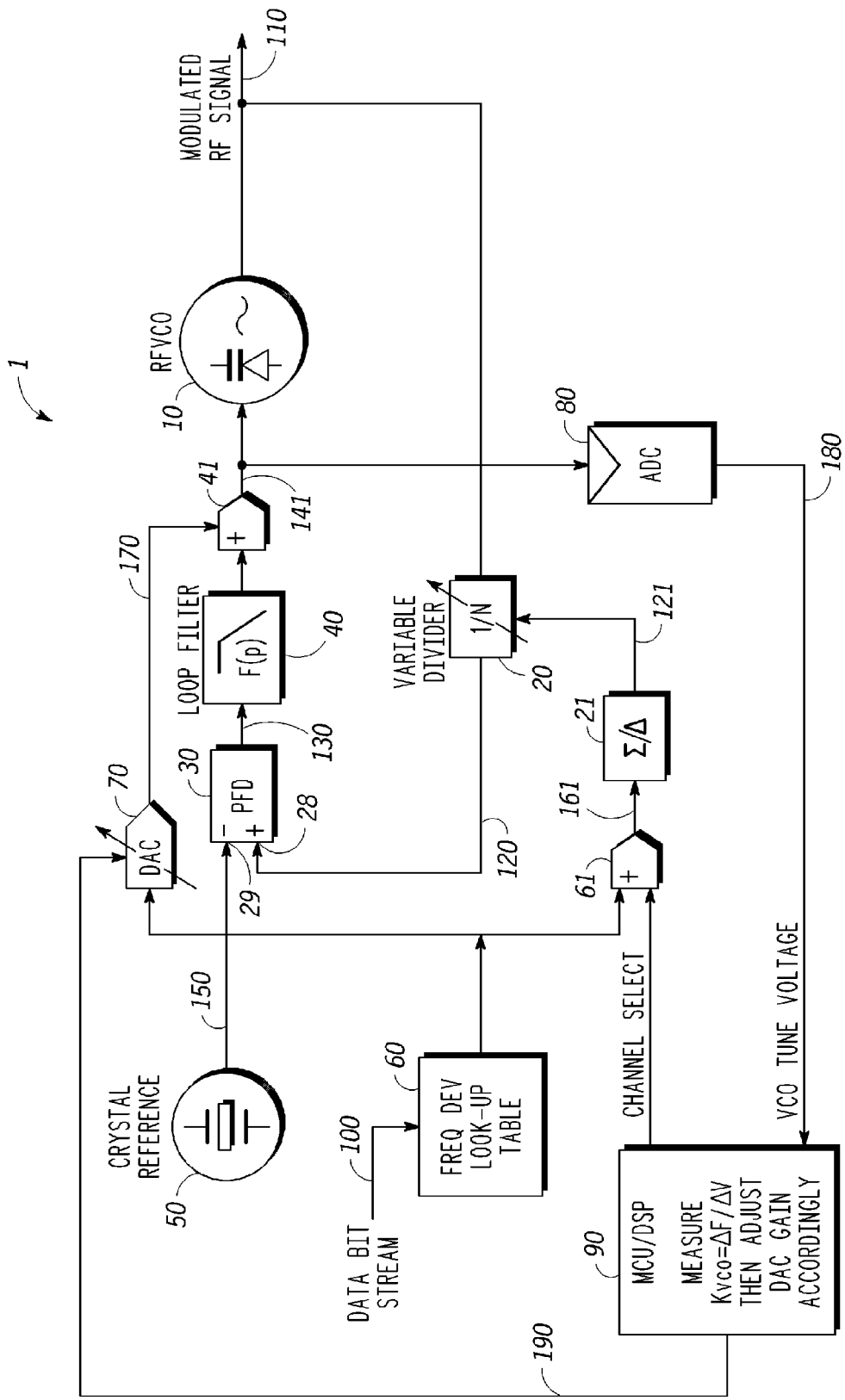
FIG. 1 is a schematic diagram of the frequency synthesiser described in our U.S. Pat. No. 6,211,747.
Figure 2:
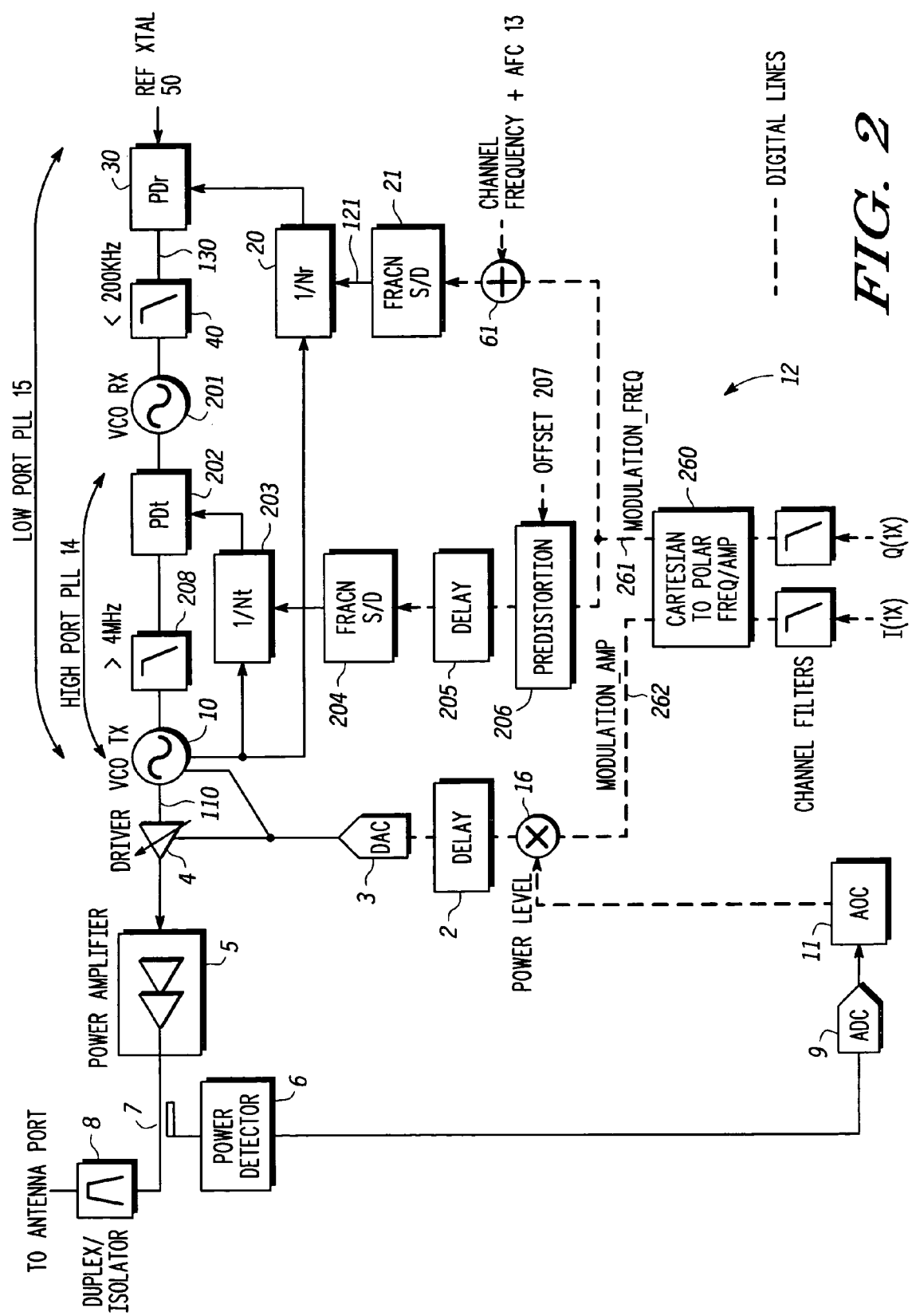
FIG. 2 is a schematic diagram of a transmitter including a frequency synthesiser in accordance with one embodiment of the invention, given by way of example.

In the transmitter of FIG. 2, similar elements to the transmitter shown in FIG. 1 bear the same reference numbers. In the transmitter of FIG. 2, the analogue dual port elements formed by the DAC 70 and the analogue adder 41 and the RFVCO 10 of the transmitter of FIG. 1 are replaced by new blocks formed by the combination of a VCO RX 201 with a high frequency reference phase-locked loop (PLL). The high frequency reference PLL comprises a phase detector 202 and a high bandwidth loop filter 208 applying the modulator signal to the RF VCO TX 10 and the feedback path comprises a variable ratio divider 203 controlled by a fractional-N sigma delta modulator 204.

The above combination has the advantage of controlling the high frequency digitally and without the need to perform compensation between the DAC 70 and the RF VCO gain slope to match them.

Referring to FIG. 2 in more detail, quadrature components I(1X) and Q(1X) of a data signal to be transmitted are supplied to the inputs of a Cartesian-to-polar coordinate converter 260. The converter 260 provides an amplitude modulation signal 262 to a multiplier 16, another input of which receives a feedback signal from a transmitter power amplifier 5, through a power detector 6 coupled inductively at 7 to the output of the power amplifier that supplies the antenna through a duplex isolator 8, which separates transmit and receive signals in the present case of a transceiver. The signal from the power detector 6 is passed through an analogue-to-digital converter 9 to an amplitude output controller 11 that processes the feedback signal and supplies the processed signal to the multiplier 16. The output of the multiplier 16 is supplied through a programmable delay circuit 2 to a digital-to-analogue converter 3, whose output controls the gain of the power amplifier 4.

The transmitter comprises a dual port phase modulator 12 that receives a frequency modulation signal 261 from the converter 260. The frequency modulation signal 261 is supplied to a pre-distorter circuit 206 and in parallel to an adder circuit 61. The pre-distorter circuit 206 compensates the modulation signal 261 to compensate for distortion introduced during later processing of the signal and a frequency offset may be applied by an offset signal 207 input to the pre-distorter circuit 206. The pre-distorted signal is supplied through a programmable delay circuit 205 to the fractional-N sigma delta modulator 204 to control the division ratio 1/Nt of the variable ratio divider 203 and the frequency, and hence the phase, of the signal supplied to the phase detector 202. The variable ratio divider 203 receives a feedback signal from the output of the VCO TX 10 and the output of the phase detector 202 is applied to a tuning port of the VCO TX 10, to control its frequency, through a low-pass filter 208 with a high cut-off frequency, higher than 4 MHz for example, so that the variable ratio divider 203, the phase detector 202 and the low-pass filter 208 form a wide-band, PLL 14.

The adder 61 receives a channel frequency selection and automatic-frequency-control ('AFC') signal 13 as well as the frequency modulation signal 261 and the resulting sum is applied to the fractional-N sigma delta modulator 21, the output 121 of which is applied to control the division ratio 1/Nr of the variable ratio divider 20. As in the transmitter of FIG. 1, the feedback signal from the variable ratio divider 20 is applied to one input of the phase detector 30, the other input of which receives frequency reference signal from the reference frequency generator 50. The variable ratio divider 20 receives the feedback signal from the output of the VCO TX 10 and the output 130 of the phase detector 30 is applied to a tuning port of the VCO RX 201 through the low pass filter 40 that has a relatively low cut-off frequency, lower than 200 kHz for example, so that the variable ratio divider 20, the phase detector 30, the low-pass filter 40, the VCO RX 201, the phase detector 202 and the low-pass filter 208 form a narrow-band, PLL 15, the wide-band, PLL 14 being nested within the narrow-band, PLL 15.

In operation, the high frequency modulation content is pre-distorted in the pre-distorter circuit 206 to compensate for the frequency response of the wide-band PLL 14, delayed in the programmable delay circuit 205 and then drives the digital modulator 204 in a manner similar to fractional N digital shaping to provide a digital frequency deviation that is oversampled. The oversampled values are used to program the divider 1/Nt 203 and the output of the divider is compared in the phase comparator 202 which operates in high frequency with the reference frequency modulated at low frequency from the VCO RX 201. Due to the high reference frequency from the VCO RX 201, the spurious noise generated inside the phase comparator 202 is at a high frequency compared to the crystal frequency 50 which allows the loop bandwidth of the wide-band PLL 14 to be increased to values which are much higher than the bandwidth of the filter 40 of the narrow-band PLL 15, thus allowing to control the high frequency modulation content accurately.

The operation of the narrow-band PLL loop 15 based on the reference frequency 50 and the phase comparator 30 and the loop filter 40 and the divider 20 is similar to that of the corresponding components of the transmitter of FIG. 1.

The divider 1/Nr 20 is modulated by the low frequency modulation content and the bandwidth of the filter 40 of the narrow-band PLL 15 is set to filter out spurious noise generated by the phase comparator 30 operating at the crystal frequency 50.

By digitally controlling the divider 1/Nt by the high frequency modulation content and the divider Nr by the low frequency modulation content, the overall frequency modulation signal is generated with accurate control since no matching is required.

It will be appreciated that, in wireless telephony, using polar modulation is known as a very effective RF transmitter technique to improve talk time and lower part count. The transmitter shown in FIG. 2 enables polar modulation to be used in wide-band applications, such as Wide-band Code Division Multiple Access ('WCDMA') for example, by applying phase modulation by the nested PLLs 14 and 15 and amplitude modulation to the power amplifier.

The transmitter shown in FIG. 2 resolves the need for large phase modulation bandwidth required by such wide-band applications by the architecture of dual port and dual loop PLLs 14 and 15, one PLL 15 operating at a narrower bandwidth to set the channel frequencies and narrow loop modulation, and its output being used to drive the other PLL 14, which has a wider bandwidth and higher operating frequencies, high frequency modulation being applied by the second port that the wide-band PLL 14 provides.

The transmitter of FIG. 2 is particularly useful in a transceiver device comprising a receiver in addition to the transmitter, especially where the transceiver is a dual-standard transceiver arranged to operate with transmission in one standard without simultaneous reception in the other. This is the case for example with a transceiver operating according to the WCDMA and Personal Communications Service/Digital Cellular System ('PCS/DCS') variants of the Global System for Mobile Communications ('GSM') standards. In fact, according to these standards, there is no DCS nor PCS reception at the user equipment while it is performing WCDMA transmission.

Figure 3:
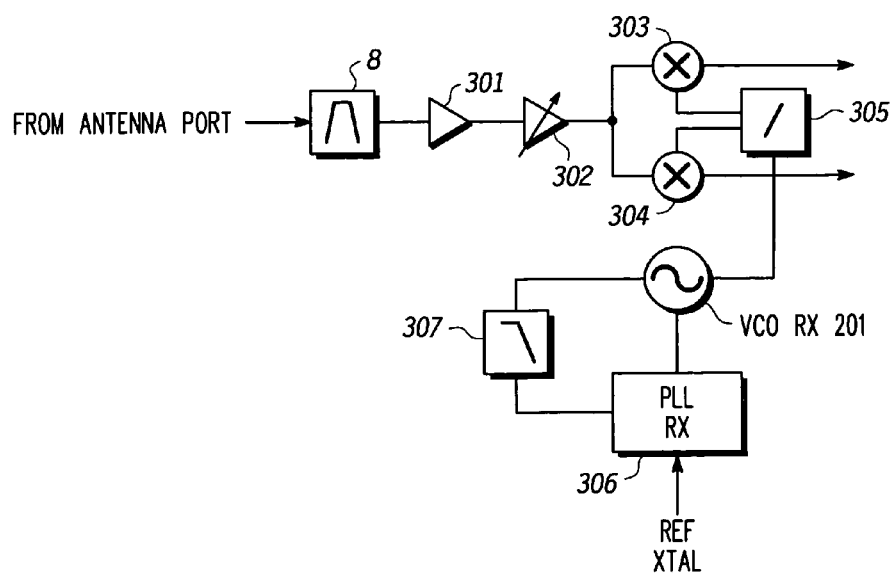
FIG. 3 is a schematic diagram of a receiver in a transceiver including the transmitter of FIG. 2.

As shown in FIG. 3, a dual-standard transceiver of this kind comprises a receiver including a demodulator with a frequency synthesiser in addition to a transmitter. In the receiver, a received signal from the antenna through the duplex isolator 8 is passed to a power amplifier 301 and a variable gain amplifier 302. The signal from the amplifier 302 is split into I and Q quadrature components and down-converted in frequency in multipliers 303 and 304 that receive VCO signal components from a VCO RX, one of which is shifted in phase relative to the other by π/2. The frequency of the VCO RX is controlled by a receive PLL comprising a phase comparator 306 applying to a tuning port of the VCO RX a feedback signal, received from the output of the VCO RX through a low pass filter 307.

As shown in FIGS. 2 and 3, in the case of a dual-standard transceiver arranged to operate with transmission in one standard without simultaneous reception in the other, the VCO RX of the receiver of FIG. 3 is the same as the VCO RX 201 used in the transmitter of FIG. 2, resulting in a substantial cost-saving. Especially in the case of the WCDMA and PCS/DCS standards referred to above, there is sufficient time between DCS/PCS reception at the user equipment and its WCDMA transmission for the frequency of the VCO RX 201 to stabilise in between the transmission and reception modes and the operational frequencies of the different standards are compatible with the use of a common VCO RX 201.

The invention claimed is:

1. A modulator comprising a multi-accumulator fractional-N frequency synthesiser for generating a carrier signal modulated by a modulation signal, the frequency synthesiser comprising a reference frequency generator for producing a reference signal, and first and second Phase Locked Loops 'PLL', said first and second PLLs including first and second Voltage Controlled Oscillators 'VCO', first and second variable frequency dividers whose division ratios (1/Nr, 1/Nt) are controlled by a phase modulation signal multi-accumulator sequence generators including a first and second multi-accumulator generator relative phases of said reference signal and the output of said first frequency divider for producing a first control signal through a first low pass filter, and a second phase detector responsive to the relative phases of the output of said second VCO and said second frequency divider signal for producing a second control signal, wherein said first control signal controls the frequency of said second VCO, said second control signal controls the frequency of said first VCO, said first and second frequency dividers both divide the frequency of the output of said first VCO, and the bandwidth of said first PLL is substantially smaller than the bandwidth of said second PLL.

2. A modulator as claimed in claim 1, and including variable gain amplifier means that is responsive to an amplitude modulation signal to modulate the amplitude of said second VCO signal.

3. A modulator as claimed in claim 1, and including delay means for modifying the phase of said phase modulation signal to which said second multi-accumulator sequence generator is responsive relative to said phase modulation signal to which said first multi-accumulator sequence generator is responsive.

4. A modulator as claimed in claim 1, and including pre-distortion means for pre-distorting said phase modulation signal to which said second multi-accumulator sequence generator is responsive.

5. A modulator as claimed in claim 4, wherein said pre-distortion means is responsive to an offset signal so as to offset the frequency of said first VCO signal.

6. A modulator as claimed in claim 1, wherein said phase modulation signals to which said first and second multi-accumulator sequence generators are responsive are digital signals.

7. A modulator as claimed in claim 1, wherein said second phase detector includes a second low pass filter frequency substantially lower than the cut-off frequency of said second low pass filter.

8. A transceiver comprising a modulator as claimed in claim 1 and a demodulator, said demodulator including a demodulator PLL including said second VCO, said modulator being arranged to be inactive during periods when said demodulator is active and said demodulator being arranged to be inactive during periods when said modulator is active.

9. A transceiver as claimed in claim 8, operable in accordance with dual-standards, including the Wide-band Code Division Multiple Access standard and the Personal Communications Service/Digital Cellular System ('PCS/DCS') variants of the Global System for Mobile Communications ('GSM') standards.

* * * * *